(12) United States Patent
Confalonieri et al.

(10) Patent No.: US 8,762,656 B2
(45) Date of Patent: Jun. 24, 2014

(54) TEMPERATURE ALERT AND LOW RATE REFRESH FOR A NON-VOLATILE MEMORY

(75) Inventors: Emanuele Confalonieri, Milan (IT); Daniele Balluchi, Milan (IT)

(73) Assignee: Micron Technology, Inc., Boise, ID (US)

( * ) Notice: Subject to any disclaimer, the term of this patent is extended or adjusted under 35 U.S.C. 154(b) by 282 days.

(21) Appl. No.: 13/142,418

(22) PCT Filed: Dec. 30, 2008

(86) PCT No.: PCT/IT2008/000814
§ 371 (c)(1), (2), (4) Date: Oct. 3, 2011

(87) PCT Pub. No.: WO2010/076826
PCT Pub. Date: Jul. 8, 2010

(65) Prior Publication Data
US 2012/0033519 A1    Feb. 9, 2012

(51) Int. Cl.
*G06F 13/00* (2006.01)
(52) U.S. Cl.
USPC .............. 711/154; 711/103; 711/E12.079
(58) Field of Classification Search
None
See application file for complete search history.

(56) References Cited

U.S. PATENT DOCUMENTS

| | | | | |
|---|---|---|---|---|
| 7,233,538 | B1 * | 6/2007 | Wu et al. | 365/222 |
| 2001/0014049 | A1 * | 8/2001 | Woo et al. | 365/211 |
| 2002/0021599 | A1 * | 2/2002 | Peter | 365/200 |
| 2002/0104030 | A1 * | 8/2002 | Ahn | 713/310 |
| 2003/0046487 | A1 * | 3/2003 | Swaminathan | 711/106 |
| 2004/0128433 | A1 * | 7/2004 | Bains | 711/106 |
| 2005/0005082 | A1 * | 1/2005 | Au et al. | 711/170 |
| 2005/0235102 | A1 * | 10/2005 | Sakurai | 711/106 |
| 2007/0280023 | A1 * | 12/2007 | Happ et al. | 365/222 |
| 2008/0046664 | A1 * | 2/2008 | Hataida et al. | 711/146 |
| 2008/0084738 | A1 * | 4/2008 | Philipp et al. | 365/185.03 |
| 2009/0198879 | A1 * | 8/2009 | Tanaka | 711/103 |
| 2011/0219203 | A1 * | 9/2011 | Nurminen et al. | 711/165 |
| 2012/0033519 | A1 * | 2/2012 | Confalonieri et al. | 365/222 |

* cited by examiner

*Primary Examiner* — Sean D Rossiter
(74) *Attorney, Agent, or Firm* — Schwegman, Lundberg & Woessner, P.A.

(57) ABSTRACT

A method and apparatus are described for measuring a temperature within a non-volatile memory, storing, in a register within the non-volatile memory, a temperature alert comprising one or more bits indicating the non-volatile memory has exceeded a threshold temperature for a period of time, determining, by a host, that the temperature alert is active, and in response to the determination that the temperature alert is active, refreshing at least a portion of the non-volatile memory.

20 Claims, 6 Drawing Sheets

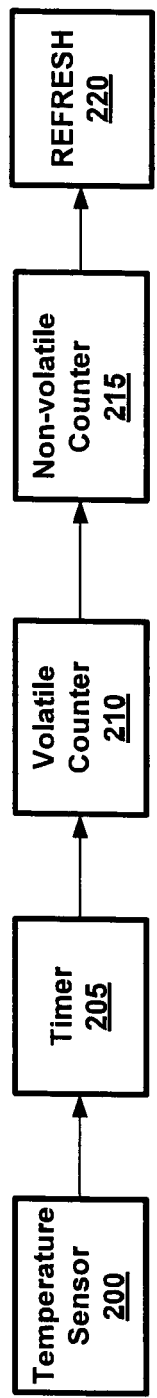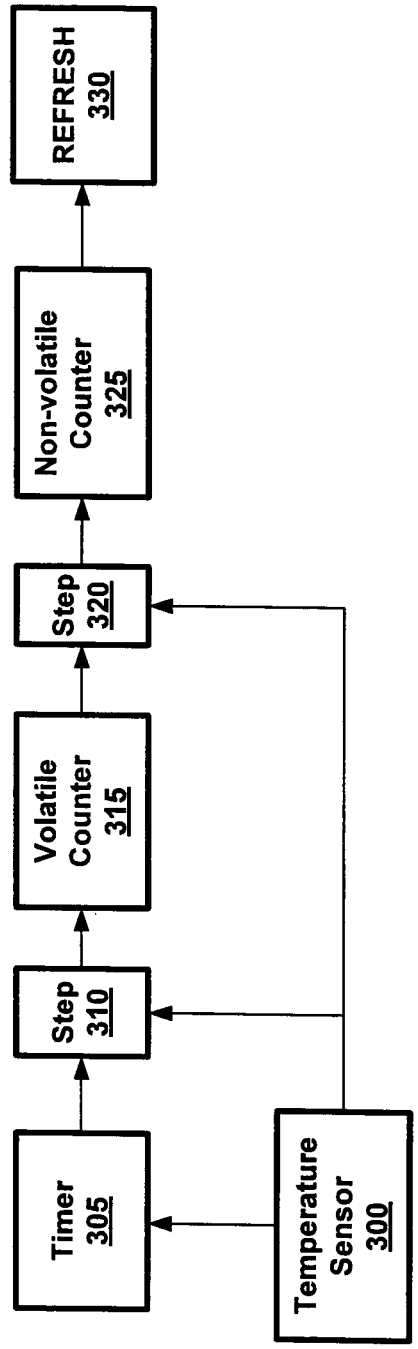
FIG. 2
FIG. 3

| RR Bit | Description | Value |
|---|---|---|
| RR.0 | Trigger Event | 0 On<br>1 Off |
| RR.1 | Page Refresh Active | 0 Yes<br>1 No |
| RR.2 | Locations Under Refresh | A5 |
| RR.3 | | A6 |
| ... | | ... |
| RR.15 | | A18 |

FIG. 6

TEMPERATURE ALERT AND LOW RATE REFRESH FOR A NON-VOLATILE MEMORY

CROSS REFERENCE TO RELATED APPLICATION

This patent application is a U.S. National Phase application under 35 U.S.C. §371 of International Application No. PCT/IT2008/000814, filed on Dec. 30, 2008, entitled TEMPERATURE ALERT AND LOW RATE REFRESH FOR A NON-VOLATILE MEMORY.

FIELD

Embodiments of the present invention relate generally to the field of application-specific electronic devices, such as computers and telecommunications equipment. More particularly, these embodiments relate to products, systems, and methods for extending the operating temperature range of a non-volatile memory.

BACKGROUND

Non-volatile memories ("NVM") are used in numerous electronic devices, including computers, video game consoles, telecommunications devices, etc. Operating temperatures have an impact on the quality and reliability of an NVM. For example, the operating temperature for a NVM may be limited to the range of −25 to 85° C. and the quality and reliability characteristics of a NVM may be defined based upon operating at 85° C. for 10 years.

Devices that utilize NVM, e.g., cellular phones, have increased their demand for performance by including features such as global positioning and mapping, streaming video, video games, etc. In order to support these features, vendors are increasing the device's "instructions per second" performance and clock frequencies. Consequently, the internal temperature of the devices is also increasing, causing a corresponding increase in memory junction temperature. Furthermore, packaging solutions like the Package-On-Package ("POP"), Multi-Chip-Package ("MCP"), and True-Silicon-Via ("TSV") increase thermal coupling. Furthermore, phase change memory ("PCM") technology is thermally driven and, therefore, more sensitive to temperature changes.

BRIEF DESCRIPTION OF THE DRAWINGS

Embodiments of the present invention are illustrated by way of example and not limitation in the figures of the accompanying drawings, in which like references indicate similar elements, and in which:

FIG. 2 is a high-level block diagram including modules to initiate the refresh of a non-volatile memory according to an embodiment of the invention.

FIG. 3 is a high-level block diagram including modules to initiate the refresh of a non-volatile memory according to an alternate embodiment of the invention.

FIG. 6 is a table showing exemplary values for a refresh register used to synchronize the non-volatile memory refresh with a host according to an embodiment of the invention.

DETAILED DESCRIPTION

A method and apparatus are described for measuring a temperature within a non-volatile memory ("NVM") and refreshing at least a portion of the NVM when the temperature exceeds a threshold temperature for a period of time. Refreshing the NVM ensures stability of the data stored within the NVM when operating at high temperatures. Embodiments of the invention extend the operating temperature range of NVM technologies to be compliant with the temperature-intense demands of DRAM specifications, increasing demands from applications, and wireless system requirements. For one embodiment, a refresh operation comprises a verify or read operation followed by an erase (if required) and programming pulses or a write operation.

Unless specifically stated otherwise, as apparent from the following discussions, it is appreciated that throughout the specification discussions utilizing terms such as "processing," "computing," "calculating," "determining," or the like, refer to the action or processes of a computer, computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Figure 1:
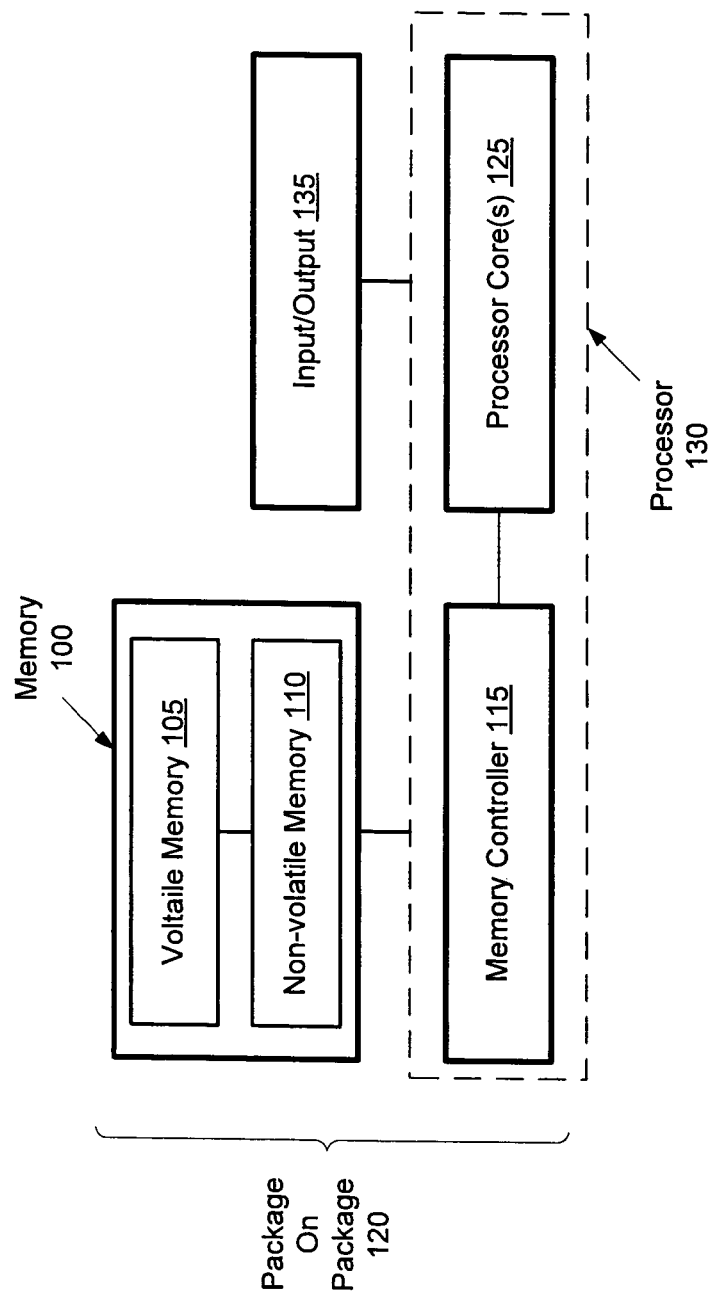
FIG. 1 is a block diagram of an exemplary device in which an embodiment of the invention is implemented.

FIG. 1 is a block diagram of an exemplary device in which an embodiment of the invention is implemented. The memory 100 may include one or more different types of memory. For one embodiment, the memory 100 includes a volatile memory 105 and a NVM 110. For an alternate embodiment, the memory 100 only includes a NVM 110.

For one embodiment, the NVM 110 is a Phase Change Memory ("PCM"), which may also be referred to as a Phase-Change Random Access Memory ("PRAM" or "PCRAM"), Ovonic Unified Memory ("OUM"), or Chalcogenide Random Access Memory ("C-RAM"). For an alternate embodiment, the NVM 110 is a magnetoresistive random access memory ("MRAM"), ferroelectric random access memory (FRAM), flash memory, erasable programmable read-only memory ("EPROM"), electrically erasable programmable read-only memory ("EEPROM"), or other non-volatile memory.

The volatile memory 105 and NVM 110 may be combined in a stacking process to reduce the footprint on a board, packaged separately, or placed in a multi-chip package with the memory component 100 placed on top of a memory controller 115 or one or more processor cores 125. For one embodiment, the memory 100 is combined with the memory controller 115 using a package-on-package 120 stacking technique.

The memory controller 115 manages the primary functions concerning the memory 100, including read requests, write requests, and memory refresh. For one embodiment, the memory controller 115 and the processor core(s) 125 are a part of the same package (the processor 130) or the memory controller 115 is integrated within a processor core 125—i.e., a processor core 125 serves as the memory controller 115. For an alternate embodiment, the memory controller 115 and the processor core(s) 125 are packaged separately. For another embodiment, one or more of the processor cores 125 are embedded with NVM 110 (not shown). For yet another embodiment, the processor 130 includes a memory controller 115 without one or more processor cores 125.

For one embodiment, the processor core(s) 125 are connected to an input/output module 135. The input/output module 135 is responsible for transferring data to and/or from the device. For one embodiment, the input/output module 135 includes a wireless transceiver such as a radio frequency ("RF") transceiver for a mobile communications device. As such, the device may operate as a cellular device or a device that operates in wireless networks such as, for example, Wireless Fidelity (Wi-Fi) that provides the underlying technology of Wireless Local Area Network (WLAN) based on the IEEE 802.11 specifications, WiMax and Mobile WiMax based on IEEE 802.16-2005, Wideband Code Division Multiple Access (WCDMA), and Global System for Mobile Communications (GSM) networks, although the present invention is not limited to operate in only these networks. For one embodiment, the input/output module 135 provides a wired connection, e.g., to communicate with another device, an external or removable memory, etc.

For one embodiment, memory 100 stores instructions that are executed by the memory controller 115 (or processor 130) during the operation of device. For one embodiment, the memory 100 stores user data, such as the conditions for when a message is to be transmitted or the actual data to be transmitted. For example, the instructions stored in the memory 100 perform wireless communications, provide security functionality for the device, user functionality such as calendaring, email, internet browsing, etc.

FIG. 2 is a high-level block diagram including modules to initiate the refresh of the NVM 110 according to one embodiment of the invention. The temperature sensor 200 measures the junction temperature within the NVM 110 (e.g., the silicon temperature of the memory). The instantaneous temperature affects electrical parameters such as the stand-by current, the saturation current of CMOS devices, etc. The junction temperature over time has an impact on the memory cells retention.

For one embodiment, at least a portion of the NVM 110 is refreshed when the temperature of the NVM 110 exceeds a threshold temperature for a period of time. For one embodiment, the threshold temperature or the period of time is set at the time the memory controller 115 or memory 100 is manufactured. For one embodiment, the threshold temperature or the period of time is programmable and can be set by either a system manufacturer, an intermediary, or by an end-user.

For one embodiment, the temperature sensor 200 is implemented within the NVM 110. If the temperature of the NVM 110 exceeds a threshold temperature, the timer 205 begins tracking the amount of time spent above the threshold temperature. For one embodiment, the timer 205 utilizes a system clock. For an alternative embodiment, the timer 205 utilizes a clock separate from the system clock, a phase-locked loop, or other known reference signal.

The amount of time the temperature exceeds the threshold temperature is tracked in two levels of granularity. For example, the first and second levels of granularity could track, respectively, the amount of time in minutes and tens of minutes, minutes and hours, hours and days, days and weeks, etc. For one embodiment, the first level of granularity is tracked within a volatile counter 210, which is stored in the volatile memory 105 and the second level of granularity is tracked within a non-volatile counter 215, which is stored in the NVM 110. If an event that would cause the loss of information in the volatile memory 105, e.g., a power loss, shut down, etc., the less significant level of granularity stored in the volatile counter 210 would be lost, but the more significant level of granularity remains stored in the non-volatile counter 215.

The volatile counter 210 is incremented each time the timer 205 reaches an additional unit of the first level of granularity. The timer 205 stops when the temperature sensor 200 determines that the instantaneous junction temperature of the NVM 110 has fallen below the threshold temperature. Nevertheless, the counters maintain an ongoing count and the timer 205 will restart anytime the instantaneous junction temperature of the NVM 110 rises above the threshold temperature again.

The non-volatile counter 215 is incremented each time the volatile counter 210 reaches a unit of the second level of granularity. Finally, a refresh 220 of at least a portion of the NVM 110 is triggered when the non-volatile counter 215 reaches the threshold period of time. For one embodiment, the refresh 220 is a trigger signal sent to the memory controller 115, which in turn performs the refresh of the NVM 110. For an alternate embodiment, the refresh 220 causes the setting of a register value, stored within the NVM 110. The system (memory controller 115 or processor 130, e.g., executing instructions from software or firmware) periodically monitors the register value and performs the refresh of the NVM 110 if the register value is set to trigger a refresh (discussed further below).

Additionally, the instantaneous junction temperature can be used to set a register value accessible by the software or by the memory controller 115 to inform the system about the high temperature level of the memory. The system is then in the position to de-rate some critical timings in response to operating at a high temperature.

FIG. 3 is a high-level block diagram including modules to initiate the refresh of the NVM 110 according to an alternate embodiment of the invention. Similar to the embodiment shown in FIG. 2, a temperature sensor 300 triggers a timer 305 and the amount of time the NVM 110 spends above a threshold temperature is tracked in two levels of granularity in a volatile counter 315 and non-volatile counter 325. If a threshold amount of time is reached, a refresh 330 is triggered. However, for this alternative embodiment, step modules 310 and 320 are added. The step modules 310 and 320 are used to increase the frequency of refresh operations as the temperature reaches higher (or more critical) levels.

The step modules 310 and 320 provide a weighting effect on one or both of the counters 315 and 325. As a result, a plurality of threshold temperatures can be set. At each increased level of operating temperature, one or both of the step modules 310 and 320 act as multipliers for the count or otherwise increase the count of the timer 305 as it triggers the count of the volatile counter 315 or the count of the volatile counter 315 as it triggers the count of the non-volatile counter 325. Alternatively, one or both of the step modules 310 and 320 acts to control the trigger levels for counters 315 and 325 respectively. As the increased levels of operating temperature are reached, the threshold levels for the first and second levels of granularity are be decreased.

For an alternate embodiment, the memory controller 115 or processor 130 monitors the degradation of a reference memory cell due to high temperature exposure to determine when to refresh at least a portion of the NVM 110. The reference cell represents the worst case of all memory array cells—i.e., it will be among the first memory cells to degrade due to a high operating temperature. For one embodiment, the reference memory cell is determined to have degraded if the value stored has crossed a threshold level.

For example, the level of the charge that passes through a memory cell (e.g., measured voltage, resistance and voltage, etc.), when read, is monitored. In a device with two memory states, "1" and "0", if the charge is above a 50 percent threshold, it has a value of 1. When the charge is below the 50 percent threshold, the value is 0. For one embodiment, the reference memory cell is set to maintain a consistent value and a reference cell threshold is set to be more sensitive than the ordinary state change threshold—e.g., in the example above, a 50 percent threshold would be ordinary and a 40 percent or 60 percent reference cell threshold would be more sensitive, depending on the consistent value stored in the reference cell. If it is determined that the value of the reference memory cell has crossed the reference cell threshold, a refresh should be initiated to prevent the NVM 110 from degrading or further degrading.

For one embodiment, the threshold level is set at the time of manufacture, programmed by a user, etc. Although the example above only includes two states of memory, the reference cell and NVM 110 can store three or more states of memory and include multiple thresholds to differentiate between the multiple states.

Figure 4:
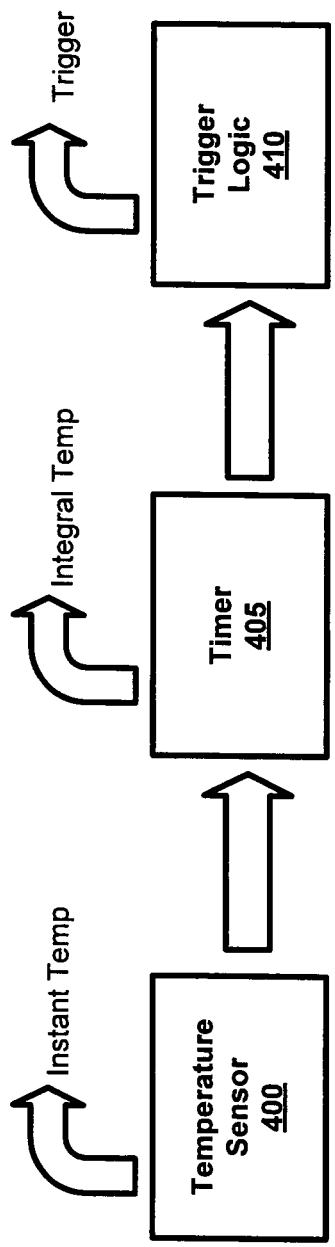
FIG. 4 is a high-level block diagram including modules to initiate the refresh of a non-volatile memory according to another alternate embodiment of the invention.

FIG. 4 is a high-level block diagram including modules to initiate the refresh of the NVM 110 according to another alternate embodiment of the invention. Similar to the embodiment shown in FIGS. 2 and 3, a temperature sensor 400 measures the junction temperature within the NVM 110. If the temperature of the NVM 110 exceeds a threshold temperature, the timer 405 begins tracking the time spent above the threshold temperature. If the temperature falls below the threshold temperature, the timer 405 stops tracking the time. The trigger logic 410 calculates the integral of the junction temperature by cumulatively combining the instant temperature measured by the temperature sensor 400 with the associated time or count as measured by the timer 405. If the integral of the junction temperature exceeds an integral threshold, the trigger logic 410 triggers a refresh of at least a portion of the NVM 110. Accordingly, both the time spent at a temperature above the threshold temperature and the amount of temperature above the threshold temperature serve as factors in the frequency of a refresh of the NVM 110.

For one embodiment, if the integral of the junction temperature does not exceed an integral threshold, the integral value is stored within the NVM 110. The next time the temperature of the NVM 110 exceeds a threshold temperature, the previous integral temperature is summed with the current integral to determine when to trigger a refresh of the NVM 110.

For one embodiment, the temperature sensor 400, timer 405, and trigger logic 410 are implemented within the NVM 110. Alternatively, one or both of the timer 405 and the trigger logic 410 is implemented within the memory controller 115 (or processor 130).

For one embodiment, the system additionally initiates a refresh operation without the use of the trigger logic, based on memory specification and system condition. For example, the memory may be refreshed once a week despite never having exceeded a threshold temperature or periodically based upon the age of the device.

Figure 5:
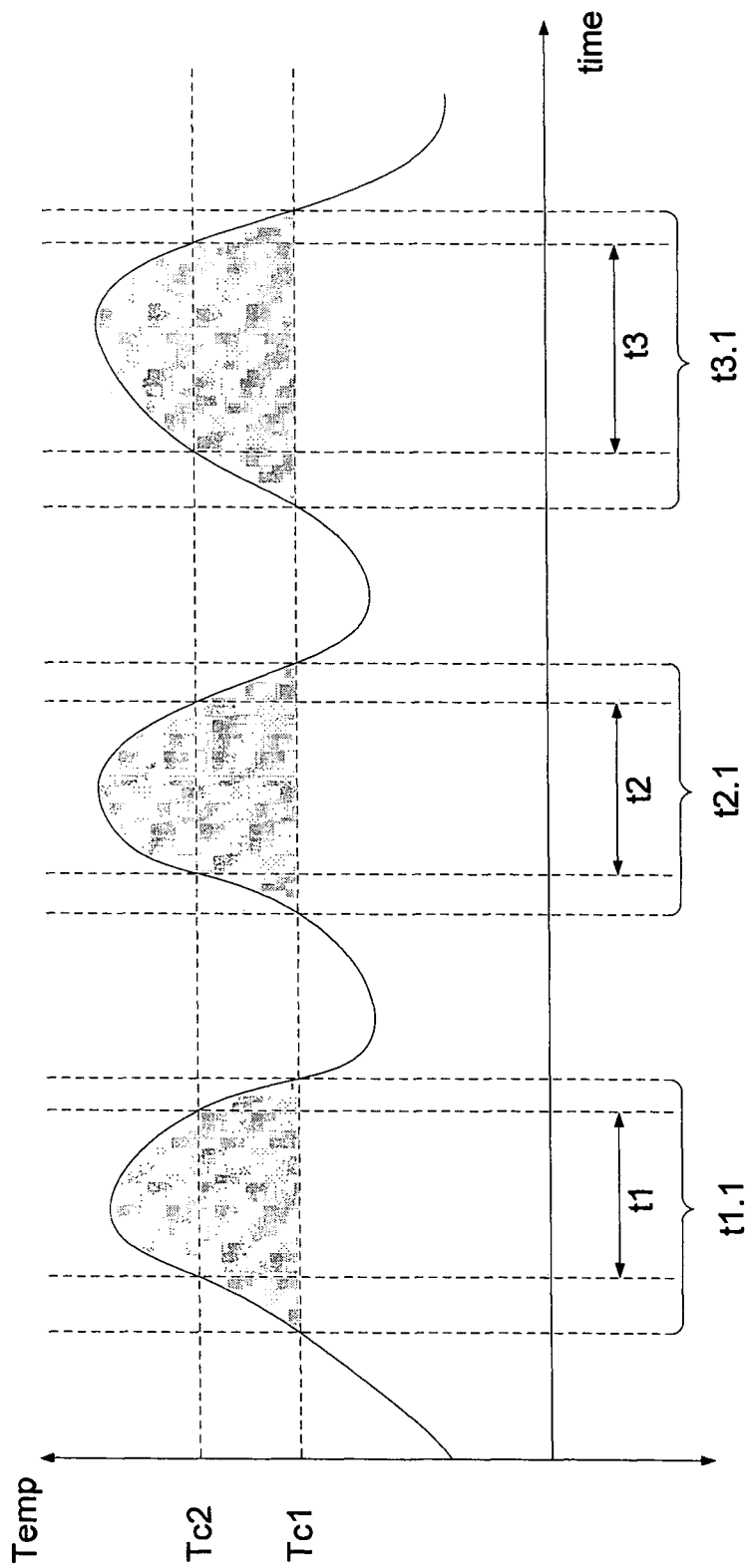
FIG. 5 is a graphical representation of an exemplary temperature of the non-volatile memory over time.

FIG. 5 is a graphical representation of an exemplary temperature of the NVM 110 over time. Referring to FIGS. 2 and 5, the timer 205 tracks the amount of time, t1.1, t2.1, and t3.1, spent above the threshold temperature Tc1. A refresh 220 of at least a portion of the NVM 110 is triggered when the non-volatile counter 215 reaches the threshold period of time within the tracking of t1.1, t2.1, and t3.1.

Referring to FIGS. 3 and 5, the timer 305 tracks the amount of time, t1.1, t2.1, and t3.1, spent above the threshold temperature Tc1. For one embodiment, one or both of the step modules 310 and 320 act to multiply, or otherwise increase, the count of the timer 305 when the temperature exceeds a second threshold temperature Tc2—during times t1, t2, and t3. Alternatively, as discussed above, the step modules 310 and 320 can act to lower the granularity or refresh trigger threshold. FIG. 5 illustrates the example of two threshold temperatures, however, embodiments of the invention may have any number of threshold temperatures to impact the frequency of refresh.

Referring to FIGS. 4 and 5, the shaded regions under the temperature curve represent the integral of the junction temperature. As discussed above, the cumulative value of the integral of the junction temperature may be stored in the NVM 110 and a refresh is triggered when the sum exceeds a threshold value.

FIG. 6 is a table showing exemplary values for a refresh register used to synchronize the NVM 110 refresh with a host (e.g., the memory controller 115 or processor 130). The refresh register contains information about the refresh operations. A trigger event bit, RR.0, is set when the NVM 110 is due for a refresh. For one embodiment, the modules of the NVM 110, as described with reference to FIG. 2 or FIG. 3, set the trigger event bit page refresh to synchronize a refresh with the memory controller 115 (or processor 130). The page refresh active bit, RR.1, is set to manage read and write requests during a refresh. Alternatively the page refresh bit might be transmitted to the memory controller 115 using a physical pin. Furthermore, a refresh-page address may be set in additional bits RR.2-RR.15 to indicate the area of the NVM 110 undergoing a refresh to manage read requests during the refresh. The refresh register of FIG. 6 is exemplary and, in alternate embodiments, may contain more or less bits, contain additional functions, or include the described functions in a different order.

Figure 7:
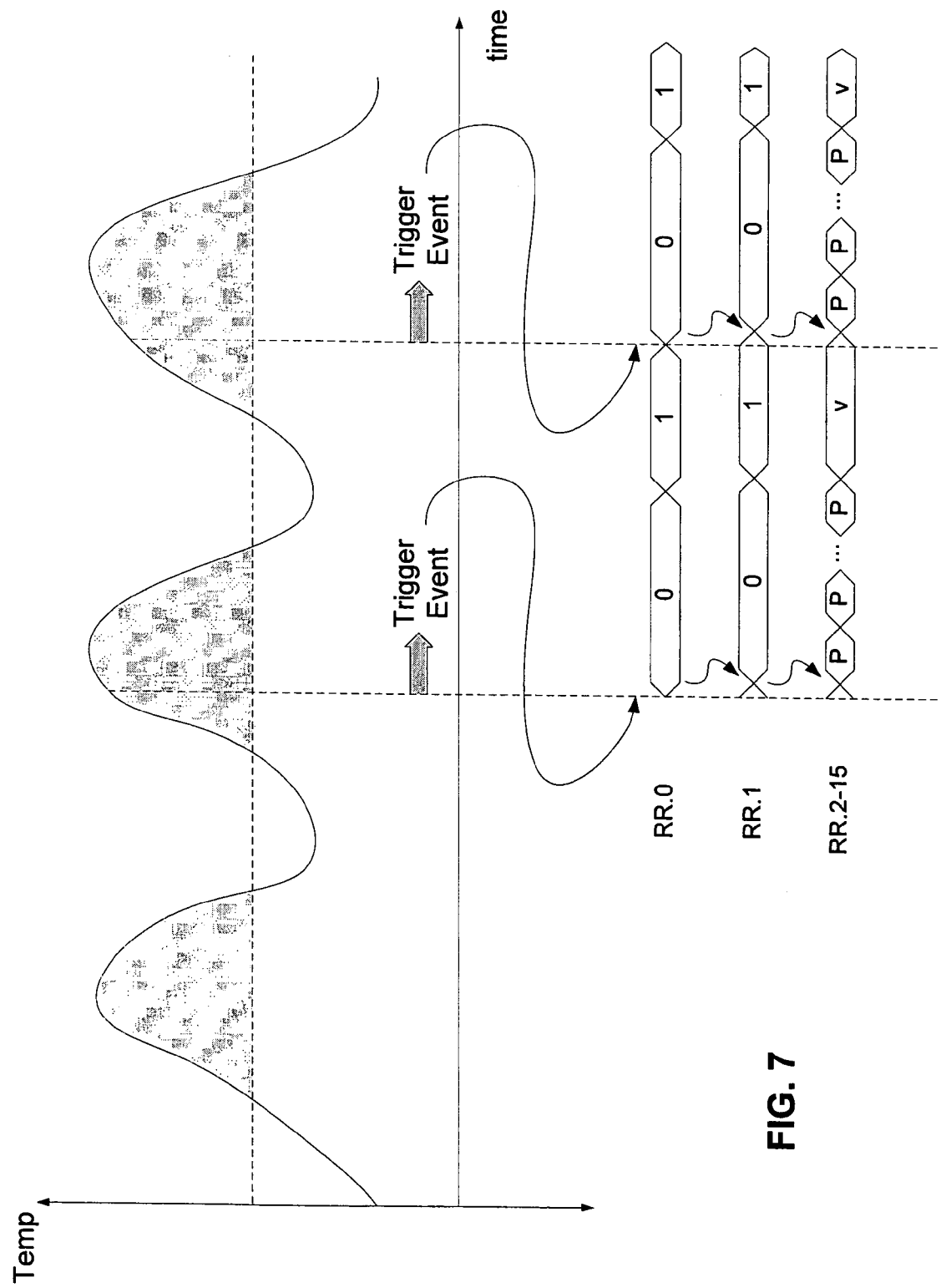
FIG. 7 is a graphical representation of an exemplary temperature of the non-volatile memory over time and corresponding refresh register values according to an embodiment of the invention.

FIG. 7 is a graphical representation of an exemplary temperature of the NVM 110 over time and corresponding refresh register values. For example, with reference to FIGS. 2 and 6, a refresh of at least a portion of the NVM 110 is triggered when the non-volatile counter 215 reaches the threshold period of time. The trigger event sets RR.0 to zero to indicate that the system should initiate a refresh. While the refresh is executed, RR.1 is set to indicate that the partition of the NVM 110 is busy and RR.2-15 are set to indicate which pages of the NVM 110 are undergoing a refresh. For one embodiment, each RR.2-15 bit can be associated with a partition. A partition is a group of pages that share common program, read, and erase circuitry.

As discussed with reference to FIG. 6, a temperature alert bit (or bits) can be set in a register within the NVM 110. The system can periodically poll the register to determine the need for a refresh of the NVM 110. For one embodiment, the memory controller 115 generates an interrupt message in response to determining that the temperature alert is active and initiates a refresh of the NVM. Alternatively, the host waits, until the current operation or operations are complete prior to initiating a refresh of the NVM 110. Furthermore, the host can postpone the refresh operation provided that additional temperature stress is within the range allowed by memory specification. For one embodiment, the refresh register includes levels of urgency for the temperature alert. Table 1 below presents exemplary values for a temperature alert including an inactive state and three levels of urgency:

TABLE 1

| Temperature Alert Status | Meaning |
| --- | --- |
| 00 | Temperature Alert Inactive |
| 01 | Temperature Alert Active - low urgency |
| 10 | Temperature Alert Active - mid urgency |
| 11 | Temperature Alert Active - high urgency |

For one embodiment, the memory controller 115 or processor 130 (e.g., according to instructions from software or firmware) prioritizes the need for an interrupt based upon the level of urgency of the temperature alert. For example, if the temperature alert is set to low urgency, the memory controller 115 waits until the current operation or operations are complete prior to initiating a refresh of the NVM 110. If the temperature alert is set to mid urgency and the current operation or operations are of a high priority, the memory controller 115 waits until the current operation or operations are complete prior to initiating a refresh of the NVM 110. If the temperature alert is set to mid urgency and the current operation or operations are of a low priority, the memory controller 115 generates an interrupt message in response to determining that the temperature alert is active and initiates a refresh of the NVM. If the temperature alert is set to high urgency, the memory controller 115 generates an interrupt message in response to determining that the temperature alert is active and initiates a refresh of the NVM.

For one embodiment, varying levels of urgency of the temperature alert are set according to the amount by which the current temperature or temperature over a period of time exceeds the threshold temperature. For one embodiment, the level of urgency may be increased corresponding to the amount of time the temperature remains above the threshold temperature beyond a threshold period of time. For one embodiment, the level of urgency may be increased corresponding to the amount the integral temperature exceeds the threshold integral. For one embodiment, a greater level of urgency is associated with a high priority portion of the NVM 110. For example, the level of urgency is set at the time of manufacture, programming, or by a user to give greater protection to some data or code stored within the NVM 110. For one embodiment, the level of urgency increases with the age or usage of the NVM 110.

For one embodiment, a level of granularity for a refresh operation is set at the time of manufacture, programming, or by a user. For one example, the refresh granularity has three levels: all partitions (a refresh is preformed on the entire memory), per partition (one partition is refreshed at a time), or per region of a partition (one region is refreshed at a time). The distribution of a refresh of the NVM 110 into partitions or regions allows flexibility for varying levels of urgency (discussed above) or for masking portions of the memory to prevent a refresh (further discussed below).

Additionally, refresh operations can be suspended and resumed—e.g., in response to a read or write request. The level of granularity for refresh operations can impact the frequency with which it is necessary to suspend and resume a refresh operation.

For one embodiment, the NVM 110 stores a region size configuration register and the size of a region is set at the time of manufacture, programming, or by a user. Table 2 below presents exemplary region size configuration register values:

TABLE 2

| Region Size Configuration | Description |
| --- | --- |
| 000 | 1 KByte |
| 001 | 2 KByte |
| 010 | 4 KByte |
| 011 | 8 KByte |
| ... | ... |

For one embodiment, when a refresh of the NVM 110 is divided into separate refresh operations for each partition or each region, a refresh status register is stored in the NVM 110 to track which portions of the NVM 110 are in need of a refresh operation and which portions do not need a refresh. Accordingly, if a portion of the memory is masked to prevent a refresh (discussed below) or if the process of refreshing one or more portions of the NVM 110 is interrupted, the memory controller 115 can determine which portions of the NVM 110 to refresh. Once a portion of the NVM 110 has undergone a refresh, the corresponding refresh status is updated. Table 3 below presents an exemplary refresh status register:

TABLE 3

| Partition/Region Number | Refresh status & Description |
| --- | --- |
| 0 | 0 - Does not need refresh |
| 1 | 1 - Needs refresh |
| 2 | 2 - Needs refresh |
| ... | ... |
| N | 0 - Does not need refresh |

For one embodiment, one or more portions of the NVM 110 are masked to prevent (or allow) a refresh operation. For example, if a portion of the NVM 110 is empty, unused, or contains invalid data, the time and resources required to perform a refresh are better saved for other operations. Additionally, if write requests are constantly directed to a portion of the NVM 110, the need for a refresh is likely obviated by the execution of the next write request. For one embodiment, the mask status of a partition or region is set by the memory controller 115 according to the state of the contents of each partition or region. For an alternative embodiment, the mask status of a partition or region is set at the time of manufacture, programming, or by a user. Table 4 below presents an exemplary mask status register:

TABLE 4

| Partition/Region Number | Mask status & Description |
| --- | --- |
| 0 | 0 - Do not refresh |
| 1 | 1 - Allow refresh |
| 2 | 1 - Allow refresh |
| ... | ... |
| N | 0 - Do not refresh |

The methods described enable one skilled in the art to develop programs, including corresponding instructions to carry out the operations (acts) represented by the logical blocks on suitably configured computers, mobile phones, consumer electronic devices, and memory cards (e.g., a processor or controller executing the instructions from machine-readable storage media). The computer-executable instructions may be written in a computer programming language or may be embodied in firmware logic or in hardware circuitry. The phrase "machine-readable storage medium" includes any type of volatile or non-volatile storage device that is accessible by a processor or controller, which is intended to be different from a machine-readable transmission medium for carrier waves.

In the foregoing specification, the invention has been described with reference to specific exemplary embodiments thereof. It will be evident that various modifications may be made thereto without departing from the broader spirit and scope of the invention. Although, for one embodiment of the invention described, the host device is a personal computer, other embodiments of the invention may implement mobile phones, personal digital assistants, digital audio/video players, digital cameras, game consoles, etc. for the host device. The specification and drawings are, accordingly, to be regarded in an illustrative sense rather than a restrictive sense.

What is claimed is:

1. An apparatus comprising:
a non-volatile memory including
a temperature sensor to measure a temperature within the non-volatile memory, and
a register to store a temperature alert comprising one or more bits indicating the non-volatile memory has exceeded a threshold temperature for a period of time;
a first counter to store a first level of granularity of time the non-volatile memory operates at a temperature above a threshold temperature;
a second counter to store a second level of granularity of time the non-volatile memory operates at a temperature above the threshold temperature, the second counter to be incremented by the first counter each time the first counter reaches a unit of the second level of granularity;
at least one step module to provide a weighting factor to the first counter or the second counter, the weighting factor being a multiplier at each increased level of operating temperature; and
a controller to determine that the temperature alert is active and, in response to determining that the temperature alert is active, refresh at least a portion of the non-volatile memory.

2. The apparatus of claim 1, wherein the temperature alert indicates one of a plurality of levels of urgency for the refresh.

3. The apparatus of claim 1, wherein the refresh of at least a portion of the non-volatile memory is performed at a pre-determined level of granularity.

4. The apparatus of claim 3, wherein the predetermined level of granularity is configured by a user.

5. The apparatus of claim 3, wherein the register indicates whether or not each of a plurality of portions of the non-volatile memory needs to be refreshed.

6. The apparatus of claim 1, wherein the non-volatile memory further includes a refresh mask register to indicate whether or not a portion of the non-volatile memory may undergo a refresh.

7. The apparatus of claim 1, wherein an amount of time the temperature exceeds the threshold temperature is tracked in more than two levels of granularity.

8. The apparatus of claim 1, wherein a rate at which the controller refreshes at least a portion of the non-volatile memory increases corresponding to an increase in temperature beyond the threshold temperature.

9. The apparatus of claim 1, wherein the temperature alert is set when an integral of the temperature during a time period when the temperature exceeds a threshold temperature exceeds a threshold value.

10. The apparatus of claim 9, wherein the non-volatile memory maintains a sum of the integral of the temperature during multiple time periods when the temperature exceeds the threshold temperature and the temperature alert is set when the sum of the integrals exceeds the threshold value.

11. A method comprising:
measuring a temperature within a non-volatile memory;
storing, in a register within the non-volatile memory, a temperature alert comprising one or more bits indicating the non-volatile memory has exceeded a threshold temperature for a period of time;
storing a value of a first level of granularity of time the non-volatile memory operates at a temperature above the threshold temperature;
incrementing a value of a second level of granularity of time the non-volatile memory operates at a temperature above the threshold temperature each time the value of the first level of granularity reaches a unit of the second level of granularity;
storing the value of the second level of granularity;
applying a weighting factor to the first level of granularity of time or the second level of granularity of time, the weighting factor being a multiplier at each increased level of operating temperature;
determining, by a controller, that the temperature alert is active; and
in response to the determination that the temperature alert is active, refreshing at least a portion of the non-volatile memory.

12. The method of claim 11, wherein the temperature alert indicates one of a plurality of levels of urgency for the refresh.

13. The method of claim 11, wherein the refresh of at least a portion of the non-volatile memory is performed at a pre-determined level of granularity.

14. The method of claim 13, wherein the predetermined level of granularity is configured by a user.

15. The method of claim 13, further comprising storing, in a register within the non-volatile memory, a refresh status to indicate whether or not each of a plurality of portions of the non-volatile memory needs to be refreshed.

16. The method of claim 11, further comprising storing, in a register within the non-volatile memory, a refresh mask register to indicate whether or not a portion of the non-volatile memory may undergo a refresh.

17. The method of claim 11, wherein an amount of time the temperature exceeds the threshold temperature is tracked in more than two levels of granularity.

18. The method of claim 11, further comprising setting the temperature alert to active when an integral of the temperature during a time period when the temperature exceeds a threshold temperature exceeds a threshold value.

19. The method of claim 18, further comprising:
storing, in the non-volatile memory, a sum of the integral of the temperature during multiple time periods when the temperature exceeds the threshold temperature; and
setting the temperature alert to active when the sum of the integrals exceeds the threshold value.

20. An apparatus comprising:
a non-volatile memory including
a reference memory cell to indicate memory degradation, and
a temperature sensor to measure a temperature within the reference memory cell;
a first counter to store a first level of granularity of time the reference memory cell operates at a temperature above a threshold temperature;
a second counter to store a second level of granularity of time the reference memory cell operates at a temperature above the threshold temperature, the second counter to be incremented by the first counter each time the first counter reaches a unit of the second level of granularity;

at least one step module to provide a weighting factor to the first counter or the second counter, the weighting factor being a multiplier at each increased level of operating temperature; and a controller to determine if the reference memory cell has degraded and, in response to determining that the reference memory cell has degraded, to refresh at least a portion of the non-volatile memory.

* * * * *